United States Patent
Fromson et al.

(10) Patent No.: US 7,441,968 B2
(45) Date of Patent: Oct. 28, 2008

(54) SPRAY DEVELOPMENT OF PHOTOSENSITIVE PLATES

(75) Inventors: Howard A. Fromson, Stonington, CT (US); William J. Rozell, Vernon, CT (US); William J. Ryan, Enfield, CT (US)

(73) Assignee: Anocoil Corporation, Rockville, CT (US)

( * ) Notice: Subject to any disclaimer, the term of this patent is extended or adjusted under 35 U.S.C. 154(b) by 57 days.

(21) Appl. No.: 11/588,714

(22) Filed: Oct. 27, 2006

(65) Prior Publication Data

US 2008/0101792 A1       May 1, 2008

(51) Int. Cl.
*G03D 5/00* (2006.01)
*B41N 3/00* (2006.01)

(52) U.S. Cl. .................................... 396/611; 101/463.1
(58) Field of Classification Search ................. 396/604, 396/611; 101/463.1
See application file for complete search history.

(56) References Cited

U.S. PATENT DOCUMENTS

| | | | | |
|---|---|---|---|---|
| 3,752,054 A | * | 8/1973 | Scanlan | 396/611 |
| 3,846,816 A | * | 11/1974 | Gaisser | 396/589 |
| 4,145,135 A | * | 3/1979 | Sara | 396/611 |
| 7,013,806 B2 | * | 3/2006 | Fromson et al. | 101/465 |
| 2003/0072575 A1 | * | 4/2003 | Fromson et al. | 396/611 |
| 2005/0066830 A1 | * | 3/2005 | Miyagawa et al. | 101/463.1 |

* cited by examiner

*Primary Examiner*—W. B. Perkey
(74) *Attorney, Agent, or Firm*—Alix, Yale & Ristas, LLP

(57) ABSTRACT

Excellent development of photosensitive coatings on planographic printing plates is achieved by directing a dynamic flow of fresh alkaline developer solution that impinges on a target area of the coating extending the width of the plate and floods the target area with a turbulent flow. At sufficient volumetric flow rate, the developer solution at the target area is constantly displaced during the development time, whereby no boundary layer forms on and travels with the plate during the development time and thus the target area is always in contact with fresh developer solution.

4 Claims, 1 Drawing Sheet

SPRAY DEVELOPMENT OF PHOTOSENSITIVE PLATES

BACKGROUND OF THE INVENTION

The present invention relates to the development of planographic printing plates, and especially lithographic printing plates having an imaged photosensitive coating with regions that are soluble in an alkaline developer solution.

Historically, the processing of positive plates involves immersion of the plate in a sump of developer as it passes through a plate processor. The plate then exits the sump, and is typically subjected to a rotating brush or molleton and a nip roll set prior to being rinsed. This method of development relies entirely on the chemical dissolution of the solubilized coating to produce the plate. The developer is an alkaline solution typically containing an alkali metal silicate and/or alkali metal hydroxide along with other wetting agent/surfactants. The temperature of the developer is critical, and must be controlled over a small range. The development is influenced by any flow dynamics (e.g. even small eddy currents) in the sump. This presents difficulties to get uniform development or consistent development from plate to plate. It is also difficult to assure that shadows and background areas clean out without attacking highlight dots in halftones.

SUMMARY OF THE INVENTION

We have discovered that excellent development can be achieved by covering the coating with a turbulent flow of fresh developer solution.

This can be achieved by discharging a dynamic flow of alkaline developer solution that impinges on a target area of the coating extending the width of the plate and floods the target area with a turbulent flow. At sufficient volumetric flow rate, the developer solution at the target area is constantly displaced during the local development dwell time, whereby no boundary layer forms on and travels with the plate during the development time and thus the target area is always in contact with fresh developer solution.

Development proceeds without a developer strength gradient from the coating surface to the substrate. As a consequence, the plate experiences no localized depletion of developer strength. Relative to known development techniques, the process of the present invention develops each unit volume of coating, more rapidly and uniformly.

In one method embodiment, an imaged plate is developed using a pressurized spray to apply the developer. The developer solution need only be sufficiently alkaline to enable the fluid to penetrate the coating. Consequently, the alkaline developer composition sufficient to give excellent results can be simply water with approximately 5% sodium metasilicate, applied at ambient temperature. The resultant developed plate has excellent uniform development. The background and shadows clean out thoroughly and the highlight dots are retained. The spray is preferably applied by a single spray bar with overlapping nozzle flow. Thus the processor length can be significantly shortened. Useful spray pressures are in the range of about 5 to about 250 psi. When this technique is used at high spray pressure, the development can be enhanced by the mechanical force of the impinging spray.

The imaged plate is preferably developed by conveying the plate on a flat support surface along a linear path in a conveying direction at a constant speed and subjecting successively overlapping target areas of the imaged coating to a pressurized, turbulent flow of alkaline developer solution. Other techniques for subjecting the target area to a turbulent flow of substantially homogeneous fresh developer are within the spirit and scope of the invention. For example, the entire plate could be flooded simultaneously in a brief burst of spray, or the plate could be drawn through a turbulent volume of developer, such that no boundary layer is formed on the plate and the plate contacts a substantially homogeneous flow of fresh developer for a known dwell time.

Another embodiment is directed to a system for developing a planographic printing plate having an imaged photosensitive coating on a substrate. The system comprises a flat support surface and a feeder for delivering plates in series to the support surface. A nozzle array is spaced from the support surface and oriented to discharge alkaline developer solution transversely onto a plate when on the support surface. A closed source vessel contains fresh alkaline developer solution, and a supply line delivers developer solution from the source vessel to the nozzle array. A pump or the like pressurizes the developer from the supply line, to the nozzle array, whereby a pressurized flow of developer solution can be selectively directed as a flow pattern transversely at the entire, but preferably a portion, e.g., up to about 25%, of the total surface area of the plate. At least one of the support surface or nozzle array is movable at a constant speed relative to the other, such that successive target areas of the plate are dynamically flooded with fresh developer solution until the plate is fully developed. Developer overflow is preferably recycled, and a replenishment flow of developer chemical can compensate for drag out and any other diminution of recycled developer effectiveness.

It can be appreciated that with the present invention, a unit area of coating is in contact with fresh developer continuously for a short but known local dwell time, and that all such unit areas on the same plate and for all subsequently developed plates experience at least a prescribed minimum dynamic development condition. Rather than achieving uniformity of development conditions by applying a known quantity of developer solution on a unit area of the plate and maintaining quiescence during a long and slow conveyance while that same quantity of developer percolates through the soluble regions, the present invention relies on the antithesis of quiescence, i.e., turbulent contact with fresh developer over a short dwell time.

An advantage arising from the range of conditions that yields acceptable developed plates, is that optimization can be achieved by mechanical adjustment or control, rather than by chemistry or temperature control. This is far easier, especially in commercial end-user operations where laboratory exactitude cannot be expected. Furthermore, a variety of plate types and sizes can be accommodated by easy adjustments to a universal developer station, such as discharge pressure, number of nozzles required to span the plate width, transport speed, and developer solution. Because only fresh developer is continuously contacting all the coating for substantially the same dwell time, without interference by a boundary layer, localized currents, or non-uniform rates of diffusion through the coating, increasing the plate size does not increase the variability of the development from one corner or edge of the plate to the opposite corner or edge.

Once a station has been calibrated for a particular plate size and type, uniformity of development is achieved automatically. If during calibration plates are either under or over developed, mechanical, not chemical, adjustments can be made, without regard to knowledge about exactly when or where under the spray pattern local development is completed.

BRIEF DESCRIPTION OF THE DRAWING

Embodiments of the invention will be described with reference to the accompanying drawing, in which.

DETAILED DESCRIPTION

Figure 1:
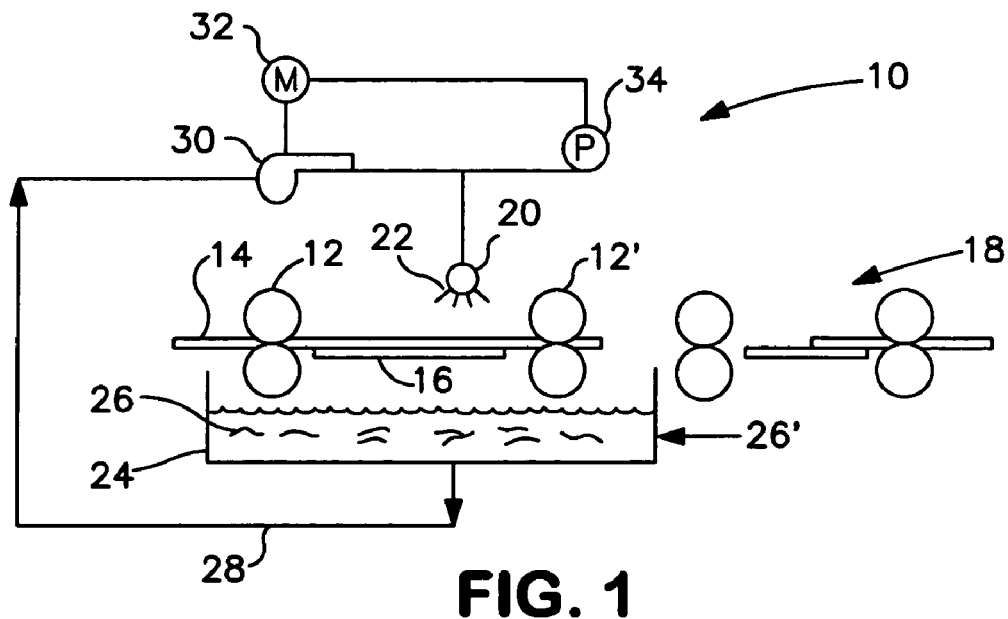
FIG. 1 is a schematic elevation view of a developer station having an array of spray nozzles for implementing one embodiment of the invention.

FIG. 1 is a schematic representation of a developer station 10 for implementing the invention with a pressurized spray of developer solution. A feeder (not shown) delivers an imaged plate 14 to a flat platen or bed 16, on which the plate will be fully developed. Preferably, the plate is transported across the platen 16 by a set of nip rolls 12, 12' spaced apart less than the length of the plate. Typically, other steps such as drying 18 can be performed after the plate 14 is passed on to another set of transport rolls. A spray header 20 delivers a dynamic spray flow 22 of developer solution transversely onto successive target areas of the plate 14 as the plate moves relative to the header 20. Nip roll 12' (or a brush, squeegee or the like) located immediately downstream of the spray pattern, assures that a negligible layer of developer remains on the plate after a given portion of the plate has been developed by and has emerged from the spray pattern.

Spent and overflow developer solution is captured in a sump 24 below support surface 16. The sump contains the source volume 26 of developer solution (for example, five to fifteen gallons). A source supply line 28 directly connects the sump with pump 30. The developer supplied via line 28 to pump 30, can be considered "fresh" in the sense that it has the required alkalinity to support the chemical reaction associated with dissolution of the relatively soluble regions of the coating (e.g., pH in the range of 9 to 13.5). Pump 30 is operated by motor 32, for delivering high pressure developer solution to the spray header 20. A pressure sensor 34 can be connected to the pump output, with a controller associated with the motor 32, for maintaining the pressure within a tight band around a desired set point. Preferably, the source can be supplemented by a flow 26' of replenishing chemical to compensate for drag out (e.g., 7 cc per square foot of developed plate) and chemical depletion due to the dissolution reactions with the coating.

The imaged plate is of a type generally known as a planographic printing plate, having a substrate of, e.g., grained, anodized, aluminum, and a photosensitive coating covering the substrate. The coating has been imaged to produce regions that are relatively insoluble in an alkaline developer solution and regions that are relatively soluble in such developer solution. According to the present invention, the imaged coating is subjected to a continuous and dynamic flow of fresh alkaline developer solution, such that a given unit area of coating experiences turbulent contact with developer solution, rather than boundary layer contact. This turbulent contact continues as coating material is dissolved, down to the substrate. In particular, as the plate is transported and developer solution deposited, a given unit volume of deposited fresh developer solution remains on a unit area of the plate for only an instant. Such unit volume of developer solution may react and become spent to some degree, but the dynamic flow of the spray pushes the spent unit volume away and essentially instantly presents another unit volume of fresh developer to the unit area. Thus, fresh developer contacts a given unit area of the plate continuously for a dwell time sufficient to clean out the background (relatively soluble regions of coating) while retaining the images (relatively insoluble regions of coating).

Figure 2:
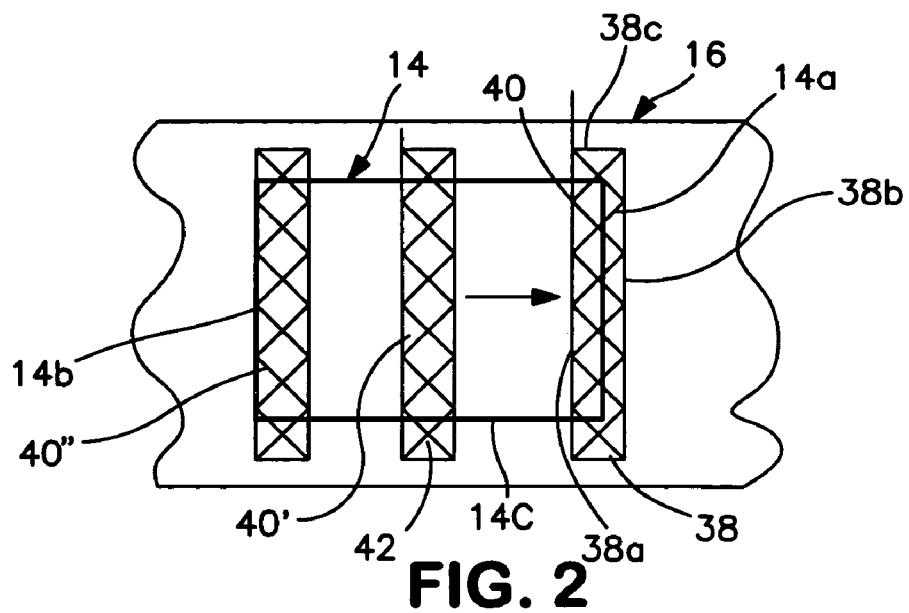
FIG. 2 a schematic representation of the continuously moving target area of spray impingement.
Figure 3:
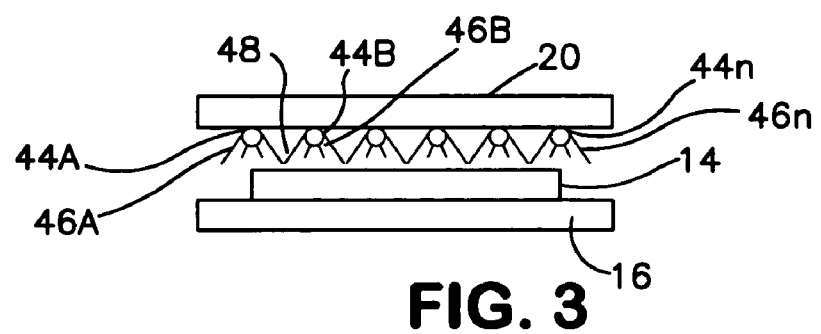
FIG. 3 is a schematic view of the spray bar and spray pattern, as seen from the right of FIG. 1.

FIGS. 2 and 3 illustrate the preferred technique for depositing the developer solution onto the plate. The plate 14 has a front end 14a, back end 14b, and sides 14c, defining a footprint on the support surface 16, that is shorter from side to side 14c, than the width of the support surface. The support surface is flat, so the plate 14 is likewise flat as the plate is transported. As the plate approaches the header 20, the front end enters the spray pattern 38, which is preferably rectangular with front impact line 38a, back impact line 38b and side impact lines 38c. As the plate enters the spray pattern 38, a plate target area 40 is flooded with developer solution. The spray pattern should have a greater width across sides 38c, than the width of the plate across sides 14c, resulting in a slight overlap 42 onto the support surface 16. The target area on the plate 14 flooded by the spray, moves across the plate at a constant speed, as the plate is transported under the header 20. Thus, successively overlapping target areas of the plate are subjected to a spray of fresh developer solution. In this context, "successively" means continually advancing.

The position of the spray pattern and thus target areas at three different and non-contiguous moments in time, are shown schematically at 40, 40', and 40" in FIG. 2. Preferably, the spray pattern is directed at a forward angle, e.g., about 20 to 45 degrees, so that the momentum of the spray at the plate surface pushes the applied developer solution toward the front of the plate, away from areas of the plate that have not yet reached the spray pattern. In the preferred embodiment, the spray pattern should impinge on only a portion of the plate, preferably less than 25% of the total area of the plate. Most favorably, the pattern impinges a target area that is less than about 20% of the total area of the plate. Stated differently, for a plate having a length in the range of about 20-30 inches, a substantially rectangular spray pattern having one dimension spanning the entire width of the plate and another dimension of about 3 or 4 inches along the plate length, would impinge on a target area in the range of about 10 to 20 per cent of the total plate area.

FIG. 3 shows that spray header 20 has a multiplicity of spaced nozzles 44a, 44b, . . . , 44n, each of which produces a spray stream 46a, 46b, . . . , 46n that may optionally overlap as shown at 48. The spray streams can be tuned with respect to direction, shape, and overlap, whereby the impact of the overall spray pattern on the target area 40 of the plate, is preferably substantially uniform with respect to volume of developer solution impingement per unit area of the target surface per unit time, and surface turbulence. Although the plate target area should experience a continuous turbulent flooding, the spray can be continual, e.g., pulsed, because the volumetric flow rate of spray is much higher than needed to dissolve the soluble regions on a strictly quiescent basis.

The spray can thus be adjusted to provide sufficient volume and pressure to push spent developer solution off the target area and thereby maintain fresh developer solution in contact with the coating throughout the target area. It is believed that dissolution of the soluble coating regions is achieved quickly and uniformly, by a flooding of the line of impingement of the developer solution (e.g., at 38a) with the newly presented coating arriving on the surface 16, such that the developer solution overlaps with turbulence at the line of impingement to the extent that the developer solution is constantly displaced, and replaced with fresh developer solution.

It can be appreciated that the dynamic flow of developer solution can be applied to the plate by means other than an array of spray nozzles spaced across the width of the plate, but such nozzle array is most convenient for new or retrofit developer stations. Any equipment or device that can flood the target area with fluid having momentum at the impingement contact with the plate, in distinction from or in addition to merely gravity driven drops, drips, and dribbles (i.e., dynamic flow), should be suitable for practicing the present invention. In all of these any of these embodiments, the coating is in essence covered with a turbulent flow of fresh developer solution. The entire coating can be covered simultaneously with turbulent flow for a dwell time of, e.g., about 5 to 10 seconds.

Such flooding should be adjusted or settable to achieve at least the minimum dynamic flow conditions as seen by the target area of the plate. Because the flow rate is so high, it is not necessary that within the spray pattern, each unit area of spray cross section have the exact same flow rate. Rather, it is important that for the local development dwell time (time under the spray pattern), each unit area of plate surface remains turbulently flooded with fresh developer.

It is also not necessary that the impact of the dynamic flow be so great as to physically dislodge partially dissolved coating material from the substrate or from neighboring coating material that has not yet experienced any dissolution. The dynamic aspect of the flooding requires only that the flow have sufficient momentum to push away depleted solution and prevent a boundary layer from forming during the development dwell time. However, it is within the scope of the invention that the dynamic flow is at such high velocity that some physical dislodging of coating material occurs.

In one implementation using equipment such as depicted in FIGS. 1-3, the header 20 is about 3 inches above the conveyed plate, and the spray pattern at the plate surface is about 3 inches from front 38a to back 38b. With a transport speed of about 7 feet per minute, a given unit area of the plate is subjected to the spray pattern for a period of only 2-3 seconds. With the nip roll 12' positioned immediately after the back 38b of the spray pattern, no significant residual developer solution remains on any given unit area of the platen. In other embodiments and variants, the development period for any unit area of plate surface would be less than 10 seconds, preferably in the range of 1-5 seconds.

The invention has been described in the context of a developer station having a sump 24 in which a standing volume 26 of developer solution is maintained for recycling back to the spray header. To reduce degradation of the developer solution through surface reaction with carbon dioxide in the ambient air, a hood or cover can be positioned over the sump, with flaps or the like at the feed and discharge ends, and gaskets along the sides where the hood rests on the frame of the developer station. Alternatively, the sump could merely function as a funneling device, with the bulk of the overall developer volume contained in a closed source vessel, which in turn has a fluid line corresponding to line 28 in FIG. 1, for delivery to the pressurizing device. Replenishing developer can be added to the sump or to the vessel.

We have demonstrated that the invention can be effectively practiced over a wide range of dynamic flow conditions at the target area on the plate. A Proteck XPH developing station was used, with modifications to pressurize the supply line 28, distribution header 20 and nozzles 44 to process imaged plates. Proteck equipment is available from Proteck Circuits & Systems Ltd., Shollinganallur, Chennai, India. The nozzles were 3 inches above the plate and the spray pattern impacted the plate at an approximate 30 degree forward angle. The plates were positive working thermal plates, Type 830.22 T, available commercially from Anocoil Corporation of Rockville, Conn., imaged identically with a Creo Trendsefter Thermal Imager at 100 mJ/cm$^2$ applied energy. Using a simple 5% sodium metasilicate solution as the developer, plates were successfully processed over a temperature range of 70 to 90 degrees F., a spray pressure range of 50 to 250 psi and throughput speeds of 1.5 to 4.0 cm/sec. Plates exhibited clean backgrounds. Measurement of the halftone values showed them to be in excellent agreement with the target values in highlight, mid-tone and shadow dot areas.

The invention further allows for plates to be developed such that the non-image background areas of the plate are cleaned out without losses of coating in the image areas. This was demonstrated in a series of test measurements as described below. Examples 1 through 3 were conducted to measure the amount of image coating loss that occurs for unexposed coating under the conditions described. Examples 4 through 6 demonstrate the efficiency of removal of the non-image background after the coating was blanket exposed (i.e., the entire coating was subjected to imaging radiation to soluibilize the coating) at an exposure of 100 mJ/cm$^2$. All plates are Anocoil 830.22 T positive working thermal plates. In all cases the developer temperature was 75 degrees F.

EXAMPLE 1

An unexposed plate was processed using the modified PROTECK XPH spray development apparatus. The developer solution was 5% sodium metasilicate (SMS), the plate dwell time was 5 seconds and the spray pressure was 70 psi. This plate exhibited a 0% loss of coating.

EXAMPLE 2

An unexposed plate was processed in the same manner as in Example 1 except that the plate dwell time was increased to 20 seconds. This plate exhibited a 23% loss of coating.

EXAMPLE 3

An unexposed plate was processed in a standard immersion type processor, model MX-33 available from CA Systems, Fort Atkinson, Wis. The developer was T-8 Thermal developer commercially available from Anocoil Corporation, which is formulated for use in this type of processor. The plate dwell time was 20 seconds in the sump of developer. This plate exhibited a 10% loss of coating.

EXAMPLE 4

A blanket exposed plate was processed as in Example 1. This plate exhibited a 100% removal of the background.

EXAMPLE 5

A blanket exposed plate was processed as in Example 3 except that the developer was a 5% SMS solution and the plate dwell time was 5 seconds. This plate exhibited a 53% removal of the background.

EXAMPLE 6

A blanket exposed plate was processed as in Example 3. This plate exhibited a 64% removal of the background.

The following conclusions can be drawn from these examples:

The inventive method of applying a simple developer composition with a 5 second dwell using a 5% sodium metasilicate (SMS) results in no loss of coating (Example 1) with complete removal of the background (Example 4).

The conventional method of plate processing in a quiescent sump with a 20 second dwell using a commercial developer (T-8) results in a 10% loss of coating (Example 3) while removing only 64% of the background (Example 6). A mechanical assist (brush) is needed to complete the background cleanout.

Example 5 shows that without the turbulence of the present invention, the background is not cleaned out in the 5 second dwell. Thus we can conclude that the success of Example 4 is not merely the result of using the 5% SMS.

Example 2 shows that spraying the 5% SMS solution for 20 seconds would result in a substantial coating loss. Thus the development time should be kept well below that of conventional development. The fact that no coating loss is seen in Example 1 is the result of the short dwell time, and is not due to the choice of 5% SMS as the developer.

The objective of the development process is to completely remove the non-image background without attacking the image coating. In conventional development there is a compromise in trying to achieve this objective; the coating suffers some loss (10% in Example 3) during the dwell required for development. In the inventive method, we are able remove the background completely in a sufficiently short time that there is no loss of coating. Coating loss is not specific to orientation; the dissolution of the coating will take place at the top surface of the coating and at the sides of the halftone dots in a screened image. Thus in the present invention, since the background is removed before the alkaline developer begins to attack the coating, the highlight dot integrity is maintained, and even the smallest of dots are retained.

It is believed that the useful range according to the invention is that any given unit area of coating be subjected to turbulent flow for up to about 5 seconds, preferably up to about 3 seconds. For example, a plate having a width of 50 cm can be subjected to a spray whereby an area of turbulent flow is established between the impingement of the spray and a set of nip rollers such that an area of 500 cm$^2$ is subjected to the turbulent flow condition at any given time. At a flow rate of 300 cc/sec, a plate moving at 2 cm/sec will have a local dwell time of 5 seconds under the turbulent flow. Thus there will be 1500 cc delivered to the surface area during this dwell time. In this example, each sq cm of plate area will see 3 cc of developer volume during the 5 second dwell in the turbulent flow. The exact conditions that are suitable will vary for any given combination of coating composition and developer solution. The main objective is to ensure that there is constant turbulent flow during the dwell time with at least the minimum volume of developer solution required to remove the coating from the plate non-image background areas. In general, successive areas of the coating are covered with turbulent flow until the entire coating has been covered, and each square centimeter of plate unit area is flooded with about 2-5 cc of a turbulent flow of fresh developer solution for about 1-5 seconds local dwell time.

Given the very narrow window and marginal success of present commercial processes for optimizing the tradeoff between cleaning out the background while retaining high image resolution over the full range of gray scale values, the ability of the present invention to easily and consistently preserve dot density (99%) corresponding to a digitally produced "solid" region of oleophylic coating, while holding 1% highlight, is extraordinary. This is achieved with a simple alkaline developer solution that does not require conditioners, such as a surfactant, to reduce dissolution of the relatively insoluble regions while the background can be cleaned out of the relatively soluble regions. Moreover, any optimization can be implemented easily by mechanical adjustment, rather than delicate chemistry and temperature control.

The invention claimed is:

1. A method of developing a planographic printing plate, having a plate substrate and an imaged coating covering the substrate and defining regions that are relatively insoluble in an alkaline developer solution and regions that are relatively soluble in an alkaline developer solution, comprising: transporting the plate on a linear path in a transport direction at a constant speed and subjecting successively overlapping target areas of the imaged coating to a turbulent flow of said alkaline developer solution for a local dwell time long enough to remove essentially all of the relatively soluble regions while short enough to retain at least about 99% of the relatively insoluble regions.

2. The method of claim 1, wherein a boundary layer of developer solution never forms on the coating while the plate is transported.

3. The method of claim 2, wherein
successive areas of the coating are covered with said turbulent flow until the entire coating has been covered;
each square cm of plate unit area is flooded with about 2-5 cc of a turbulent flow of fresh developer solution for about 1-5 seconds local dwell time;
the turbulent flow is at sufficient pressure to continuously push spent developer solution off the plate and thereby maintain fresh developer solution in contact with the coating throughout said local dwell time; and
after each unit area of the plate is covered for said local dwell time, any residual developer solution remaining on said unit area is immediately removed.

4. The method of claim 3, wherein said residual developer solution is removed by at least one of a nip roller or squeegee.

* * * * *